(12) United States Patent
Holmberg et al.

(10) Patent No.: US 6,294,730 B1
(45) Date of Patent: Sep. 25, 2001

(54) ADAPTED ELECTRICALLY CONDUCTIVE LAYER

(75) Inventors: Per Holmberg, Dalby; Lars Eriksson, Emmaboda, both of (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 0 days.

(21) Appl. No.: 09/299,435

(22) Filed: Apr. 26, 1999

(30) Foreign Application Priority Data

Apr. 27, 1998 (SE) .................................................. 9801502

(51) Int. Cl.[7] .................................................. H05K 9/00
(52) U.S. Cl. .......................................... 174/35 R; 361/816
(58) Field of Search ........................... 174/35 R, 35 MS; 361/816, 818, 752, 753, 800

(56) References Cited

U.S. PATENT DOCUMENTS

| | | | |
|---|---|---|---|
| 5,206,796 | * 4/1993 | Thompson et al. | 361/816 |
| 5,334,800 | 8/1994 | Kenney | 174/35 R |
| 5,360,941 | * 11/1994 | Roes | 174/35 R |
| 5,596,170 | * 1/1997 | Barina et al. | 174/35 R |

FOREIGN PATENT DOCUMENTS

| | | |
|---|---|---|
| 2 298 387 | 9/1996 | (GB) . |
| WO97/34459 | 9/1997 | (WO) . |

OTHER PUBLICATIONS

Sandh, H.; International–Type Search Report, Feb. 19, 1999, pp. 1–3; Search Request No. SE98/00776.

\* cited by examiner

Primary Examiner—Dean A. Reichard
Assistant Examiner—Hung V Ngo
(74) Attorney, Agent, or Firm—Jenkens & Gilchrist

(57) ABSTRACT

The invention relates to an electrically conductive unit having electrically conductive paths, which are directly or indirectly applied onto a case for creating a screening against electromagnetic radiation and for the draining of electrical currents.

19 Claims, 2 Drawing Sheets

ADAPTED ELECTRICALLY CONDUCTIVE LAYER

TECHNICAL AREA OF THE INVENTION

In order to screen against electromagnetic radiation and/or to drain electrical fields, e.g. static electricity, from ECD, electrical devices or from antenna elements or similar, for balancing of another antenna and/or draining and taking care of ground currents, electrically conductive layers of various types are currently used, which are located directly or indirectly in connection with a protective cover. This can be arranged by using various application methods for the layers, e.g. screen or tampon printing. Other methods, like spray painting and vacuum vaporisation of metallised material, are also used. Various types of metal foils or sheet metal can also be used and fitted as protectors for this purpose.

When using spray painting and vacuum metallising, one problem is that the material is spread around, in such a manner that a substantial portion thereof will not end up on the part to be supplied with the electrically conductive layer. This entails a large waste of material. Another problem concerning these methods is that the material will also end up on areas that are not to be metallised, such as openings, projections and fasteners. Parts and/or surfaces must then be masked before surface treatment, or the coating must be removed after the surface treatment. Furthermore, it is difficult for the material to reach into and build up layers in nooks and corners, resulting in lack of material there, which must then later be replenished so as not to impair the function. Alternatively, an excessively thick layer must be applied, to ensure coverage in these inaccessible areas. In some areas, such thick layers of material, as these methods will involuntarily cause are not necessary; consequently, this will also contribute to unnecessary material consumption. Thus, with these methods, a predetermined material thickness cannot be achieved with any high precision.

With screen and tampon printing it is possible to print a metallic layer on the surface of a component. Printing is however difficult on complicated surfaces that are very curved, surfaces located at sharp corners, surfaces located at openings and recesses, and surfaces located close to protrusions and abrupt elevations.

To manufacture prefabricated metal foils or sheets with the aim of producing the layer in question is expensive and time-consuming in production and, furthermore, they will be difficult to fit into a case.

SUMMARY

The object of the present invention is to eliminate the existing drawbacks with the above designs and to simplify and reduce the cost for providing cases with complete, functioning, electrically conductive layers and to create radio-frequent and conductive paths where the least damage is done or the highest benefit is achieved. The characterising features of the invention are stated in the appended patent claims.

Owing to the invention, an electrically screening and draining unit, without the above disadvantages, has been provided. According to the invention, the unit thus exhibits a network of electrically conductive paths of varying width, thickness, length and distribution along the case surface, creating a "Faraday cage". The electrically conductive paths extend, according to the invention, along those predetermined surfaces where they most efficiently screen the electromagnetic radiation and where they drain the electricity, instead of providing, according to the present-day method, the entire case surface with a metallic layer. In a preferred embodiment, an electrically conductive pattern, creating paths, is tampon printed on e.g. the inner surface of a telephone case, in such a way that printing on curved surfaces, at holes, on protrusions, in recesses, sharp corners, etc. is avoided. The case is only provided with these electrically conductive paths at those locations where a metallic layer is necessary. In order to achieve improved conductive properties at selected locations, a wider and/or thicker path may be printed. In this manner, a large amount of material will be saved, where saving is possible. Furthermore, the difficulties arising from printing on inaccessible areas are avoided by allowing the paths to run beside such locations. In order to be able to print the paths on difficult areas, bridges may provide a base. Such bridges can level out corner radii as well as provide the base at e.g. annular formations around holes and protrusions. The paths may furthermore be placed at other suitable locations to provide adhesion against the underlying material. On the larger surfaces of the case, material may also be saved by printing paths in various network structures also here, e.g. shaped like a number of circles, squares, ellipses, rhomboids, triangles, octants, hexagons, loops, ending extensions towards e.g. holes, etc. or being of optional shape. By suitable reshaping of the layer, a good screening as well as a good adhesion of e.g. an adhesive on the underlying base surface, is obtainable.

The invention can also be applied by screen-printing the electrical unit onto a foil, or by stamping out a metal foil or metal sheet, configured as described above in the preferred embodiment of the invention, and subsequently fitting it into a case. Naturally, these methods may also be combined in the same electrical unit.

All types of cases can be screened and drained of electromagnetic radiation by means of the invention.

The invention will be described in more detail below by means of some preferred embodiment examples, with reference to the attached drawings.

DETAILED DESCRIPTION OF EMBODIMENTS

Figure 1:
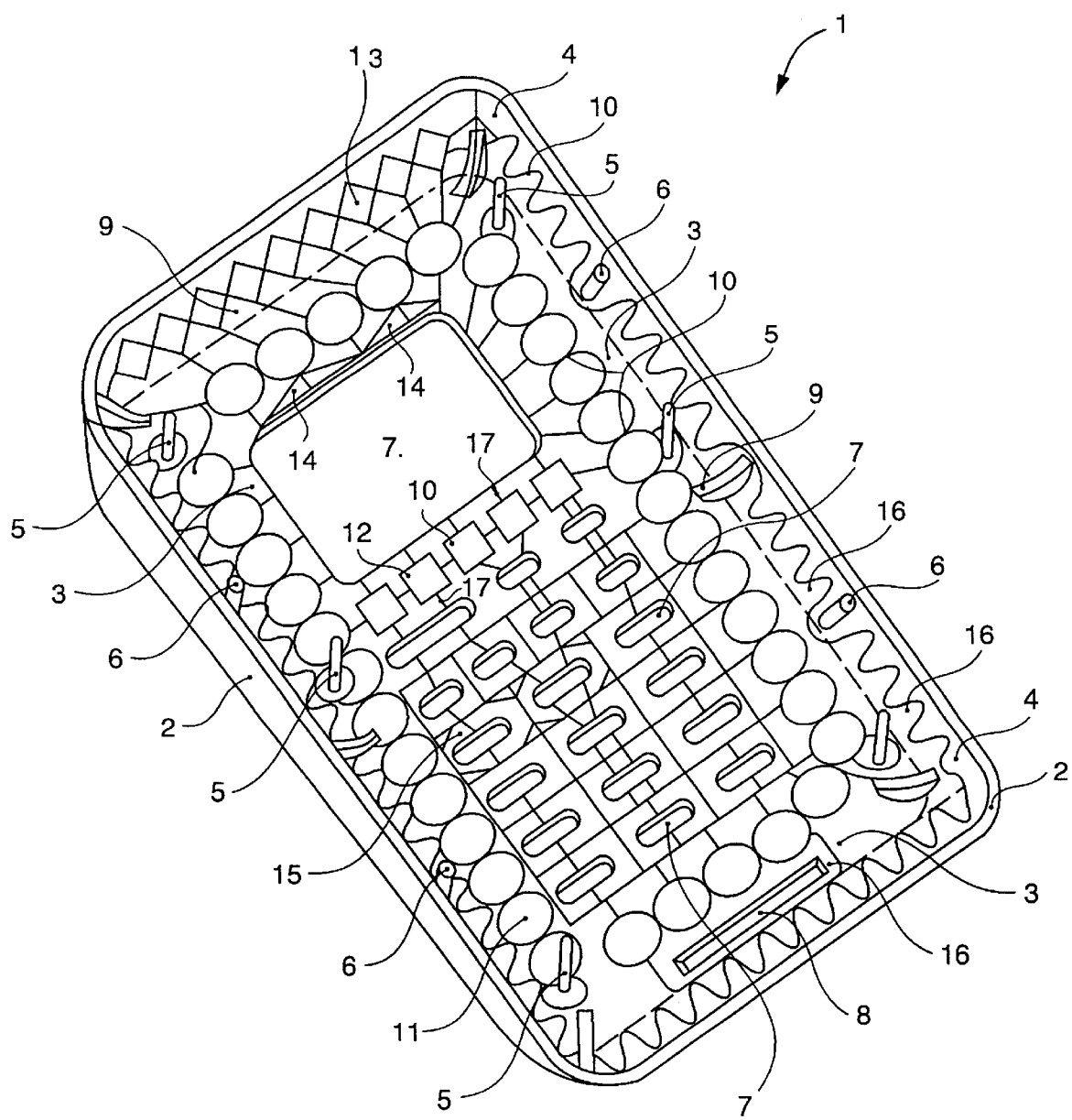
FIG. 1 shows a schematical perspective view of a case with electrically conductive paths, seen obliquely from above.

As can be gathered in detail from FIG. 1, the device according to the invention comprises an electrically conductive unit 1, arranged directly or indirectly on the inside of a case 2, which is to screen electromagnetic radiation and/or drain off electricity. In this preferred embodiment the conductive unit 1 is tampon printed on the surface 3 of the case 2, of which certain areas are difficult to print on, or inaccessible, like e.g. corners 4, protrusions 5, fittings 6, openings 7, recesses 8, curved surfaces 9. According to the invention it is possible, with a minimum of material, to produce the conductive unit 1 and, at the same time, to avoid surfaces 4–9 inaccessible for printing, by one or more electrically conductive path(s) 10, having a suitable width, distribution, thickness and formation, acting as screening against electromagnetic radiation and draining currents, to an intended amount and magnitude, in those locations where they are most useful. In this way, an optimum function is achieved with an extremely small material requirement.

Circles and ellipses 11, squares and rectangles 12, rhomboids 13, triangles 14, octants to "polytants" 15, loops 16, endings 17 and other optional formations are interconnected to shape the conductive unit 1 for optimum performance.

Figure 2:
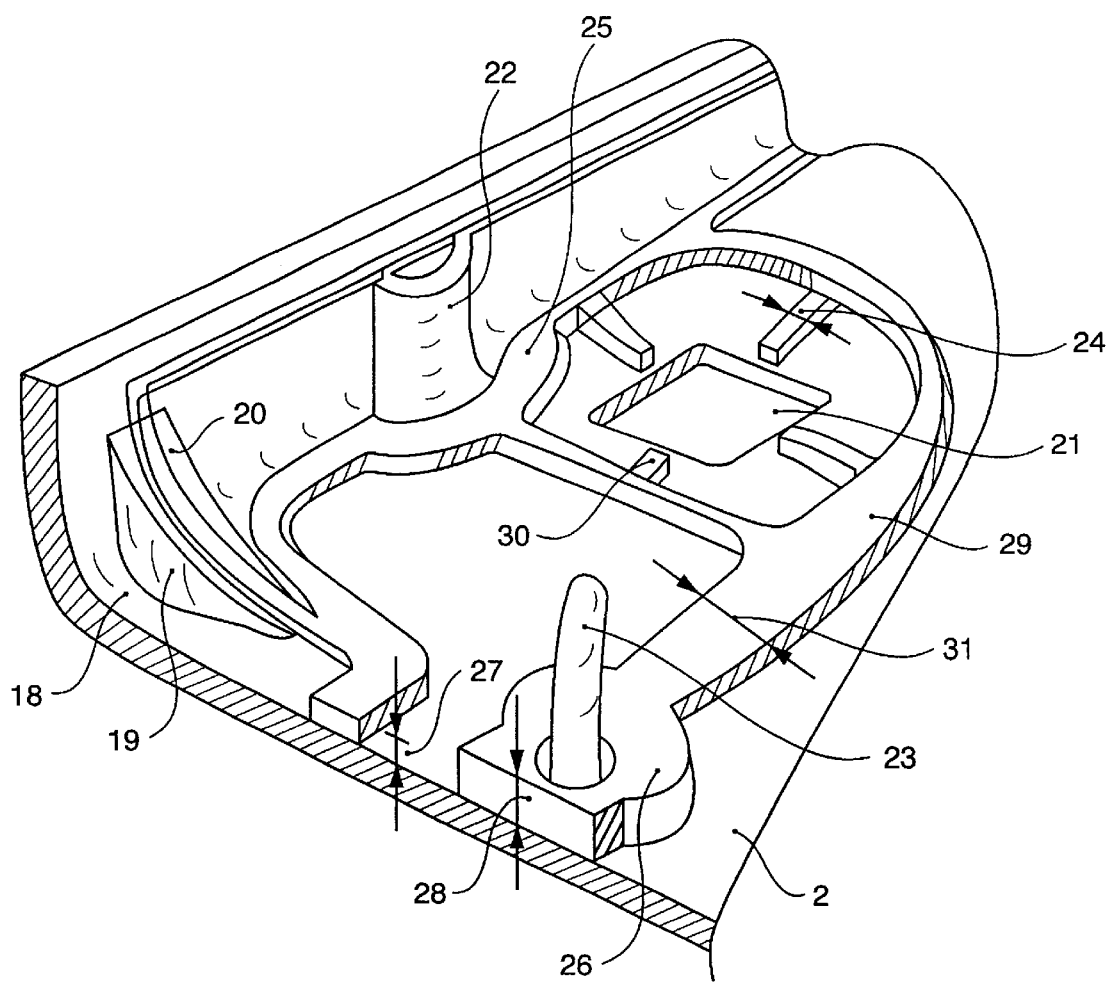
FIG. 2 shows a perspective view of a cut-through part of a case, seen obliquely from above.

As can be seen from the embodiment shown in FIG. 2, a surface 18 on the case 2, being very difficult to print, has been provided with bridges 19 for creating a printing base 20, making the difficult surface 18 easy to print. Adequate function will be obtained anyway by allowing paths 29 to run on bridges 19 at suitable locations. In this way, printing on inaccessible surfaces 4–9 according to FIG. 1 can be avoided. The electrically conductive path can be of different shape, extension, width and thickness. The opening 21 needs to be screened and drained. This can be achieved with endings 30. Around the fitting 22, a suitable loop can be made. The protrusion 23 is surrounded by the circle 26. Various widths 24, 31 of the path 29 are also needed to obtain an optimum function, as are various thickness 27, 28. Different thickness can be achieved by a number of superimposed prints or be managed by printing with a thicker layer of material.

What is claimed is:

1. A device for reducing electromagnetic radiation within a case, the device comprising:

at least one surface within the case, wherein the surface includes at least one bridge having a printing base surface formed thereon; and an electrically conductive layer disposed on at least selected portions of the surface and arranged to shield against electromagnetic radiation and carry electrical currents, the electrically conductive layer comprising a plurality of electrically conductive paths, at least one of said paths being disposed on the printing base surface of the bridge.

2. A device according to claim 1, wherein the electrically conductive paths are of varying width and thickness.

3. A device according to claim 1, wherein the electrically conductive paths are applied on the surface using at least one printing technique selected from a group comprising tampon printing and screen-printing.

4. A device according to claim 1, wherein the step of selectively forming the electrically conductive layer, further includes electrically connecting each of the plurality of electrically conductive paths together.

5. A device according to claim 1, wherein at least a portion of the electrically conductive layer is formed using a metallic sheet applied to the surface.

6. A device according to claim 1, wherein the surface further includes at least one feature that is at least partially surrounded by the electrically conductive layer.

7. A device according to claim 6, wherein the surface further includes at least one region having an aperture formed therein, and the electrically conductive layer further includes a network of electrically conductive paths located proximate to said aperture.

8. A device according to claim 1, wherein at least a portion of the electrically conductive paths are configured to provide at least one shape selected from a set of shapes comprising a circle, a square, an ellipse, a rhomboid, a triangle, an octant, a hexagon, a loop, and a polygon.

9. A device according to claim 1, wherein the electrically conductive layer is further configured to act as a Faraday cage within the case.

10. A device according to claim 1, wherein each of the plurality of electrically conductive paths are electrically connected together.

11. A method for reducing electromagnetic radiation within a case, the method comprising:

providing a case having at least one surface therein, and further providing at least one bridge connected to the surface, the bridge having a printing base surface formed thereon; and selectively forming an electrically conductive layer on at least portions of the surface, the electrically conductive layer being arranged to shield against electromagnetic radiation and carry electrical currents through a plurality of electrically conductive paths, at least one of said electrically conductive paths being formed on the printing base surface of said bridge.

12. A method according to claim 11, wherein the electrically conductive paths are of varying width and thickness.

13. A method according to claim 11, wherein the step of selectively forming the electrically conductive layer further includes, using at least one printing technique selected from a group comprising tampon printing and screen-printing.

14. A method according to claim 11, wherein the step of selectively forming the electrically conductive layer, further includes configuring the electrically conductive layer to act a Faraday cage within the case.

15. A method according to claim 11, wherein the step of selectively forming the electrically conductive layer further includes, forming at least a portion of the electrically conductive layer from a metallic sheet and applying the at least a portion of the electrically conductive layer to the surface.

16. A method according to claim 11, wherein:

the step of providing the case further includes, providing at least one feature on the surface; and the step of selectively forming the electrically conductive layer, further includes at least partially surrounding the feature with the electrically conductive layer.

17. A method according to claim 16, wherein:

the step of providing the case further includes, providing at least one region on the surface having an aperture therein; and the step of selectively forming the electrically conductive layer further includes forming a network of electrically conductive paths proximate to said aperture.

18. A method according to claim 11, wherein the step of selectively forming the electrically conductive layer, further includes forming at least a portion of the electrically conductive paths in at least one shape selected from a set of shapes comprising a circle, a square, an ellipse, a rhomboid, a triangle, an octant, a hexagon, a loop, and a polygon.

19. A device for reducing electromagnetic radiation within a case comprising:

at least one surface within the case;

an electrically conductive layer disposed on at least selected portions of the surface and arranged to shield against electromagnetic radiation, said electrically conductive layer comprising a plurality of electrically conductive paths which vary from one another in regard to at least one specified physical dimension, said specified dimension being selected from a group comprising width and thickness; and said surface includes at least one bridge having a printing base surface formed thereon, and at least one of said electrically conductive paths is disposed on the printing base surface of said bridge.

* * * * *